United States Patent
Lin et al.

(10) Patent No.: US 10,863,133 B2
(45) Date of Patent: Dec. 8, 2020

(54) READOUT CIRCUIT USING SHARED OPERATIONAL AMPLIFIER AND RELATED IMAGE SENSOR

(71) Applicants: Egis Technology Inc., Taipei (TW); Igistec Co., Ltd., Hsinchu County (TW)

(72) Inventors: Yu-Hsuan Lin, Hsinchu County (TW); Chung-Yi Wang, Hsinchu County (TW)

(73) Assignees: Egis Technology Inc., Taipei (TW); Igistec Co., Ltd., Hsinchu (TW)

( * ) Notice: Subject to any disclaimer, the term of this patent is extended or adjusted under 35 U.S.C. 154(b) by 0 days.

(21) Appl. No.: 16/716,464

(22) Filed: Dec. 16, 2019

(65) Prior Publication Data

US 2020/0221044 A1 Jul. 9, 2020

Related U.S. Application Data

(60) Provisional application No. 62/787,775, filed on Jan. 3, 2019.

(30) Foreign Application Priority Data

Oct. 10, 2019 (CN) .......................... 2019 1 0960204

(51) Int. Cl.
*H04N 5/378* (2011.01)
*H03F 3/45* (2006.01)

(52) U.S. Cl.
CPC .............. *H04N 5/378* (2013.01); *H03F 3/45* (2013.01); *H03F 2203/45512* (2013.01)

(58) Field of Classification Search
CPC ...................... H04N 5/335–379; H01L 27/146
See application file for complete search history.

(56) References Cited

U.S. PATENT DOCUMENTS

| 2004/0222351 A1* | 11/2004 | Rossi | ................... H04N 5/3575 250/208.1 |
| 2013/0063635 A1* | 3/2013 | Kobayashi | ............. H04N 5/378 348/294 |

* cited by examiner

*Primary Examiner* — Paul M Berardesca
(74) *Attorney, Agent, or Firm* — Winston Hsu

(57) ABSTRACT

A readout circuit for reading sensed signals of a pixel array. The readout circuit includes: an operational amplifier, a plurality of switching devices and a computation circuit. The operational amplifier is arranged to generate an output signal in each amplifier output cycle. In each amplifier output cycle, each of the switching devices is controlled by a switch controlling signal to selectively couple pixel circuits to the differential input terminals of the operational amplifier. The computation circuit is arranged to the recover a plurality of sensed signal respectively corresponding to a plurality of pixel circuits. In each amplifier output cycle, at least two of the switching devices are turned on, such that the operational amplifier receives the sensed signals of at least two pixel circuits in the pixel array simultaneously and sums the sensed signals of the at least two pixel circuits to generate the output signal.

12 Claims, 7 Drawing Sheets

READOUT CIRCUIT USING SHARED OPERATIONAL AMPLIFIER AND RELATED IMAGE SENSOR

CROSS REFERENCE TO RELATED APPLICATIONS

This application claims the benefit of U.S. Provisional Application No. 62/787,775, filed on Jan. 3, 2019 and China Patent Application No. 201910960204.2, filed on Oct. 10, 2019. The entire contents of the related applications are incorporated herein by reference.

BACKGROUND OF THE INVENTION

1. Field of the Invention

The present invention relates to image sensing, and more particularly, to a readout circuit for use in an image sensor to read pixel circuits and related image sensor thereof.

2. Description of the Prior Art

An image sensor relies on a readout circuit to read sensed signals from a pixel array. The readout circuit includes an operational amplifier as a buffering stage, thereby to amplify or buffer the sensed signals. Due to hardware cost, some designs allow multiple channels of the image sensor to share a same operational amplifier. The operational amplifier has to respectively amplify/buffer sensed signals of different pixel circuits at different timings. In such designs, it is essential to control the timing properly, such that the exposure time of a single pixel circuit is limited.

If an operating cycle of the readout circuit (i.e., a period of time required by reading a row of pixel circuits) is T and the readout circuit is required to read data from N pixel circuits in one operating cycle, an available exposure time for reading a single pixel circuit cannot exceed T/N in the case where the image sensor uses the shared operational amplifier. On the other hand, an available exposure time for reading a single pixel circuit will be T in the case where the image sensor does not use a shared operational amplifier. For example, assuming that an image sensor has 200 rows pixel circuits and is required to output one frame every 16 ms, the available exposure time for each pixel circuit will be 16 ms/200/8=10 µs if every 8 channels share a same operational amplifier. On the other hand, the available exposure time for each pixel will be 16 ms/200=80 µs if no channel shares a same operational amplifier. In light of above, in the case where the shared operational amplifier is used, the available exposure time for a single pixel circuit is significantly limited.

SUMMARY OF THE INVENTION

To address the above-mentioned problems, it is one object of the present invention to provide improved architecture. Under the architecture of the present invention, a shared operational amplifier is used thereby to reduce the hardware cost and the size of the image sensor, but the exposure time for a single pixel circuit is extended. In order to use the shared operational amplifier and extend the available exposure time for a single pixel circuit, the present invention allows different rows/columns of the pixel circuits to be exposed and read by the shared operational amplifier at the same time. Furthermore, the present invention encodes channel signals. Thus, even though the shared operational amplifier mixes up sensed signals of different rows/columns of the pixel circuits when processing them, these sensed signals of different rows/columns of pixel circuits still can be separated and recovered based on applied encoding.

According to one embodiment, a readout circuit for reading sensed signals of a pixel array is provided. The readout circuit comprises: an operational amplifier, a plurality of switching devices and a computation circuit. The operational amplifier is arranged to generate an output signal according to input signals on a set of differential input terminals in each one of a plurality of amplifier output cycles. Each of the switching devices is coupled between a pixel circuit of the pixel array and the differential input terminals. In each amplifier output cycle, each switching devices is controlled by a switch controlling signal to selectively turn on, thereby to selectively couple the pixel circuit to the differential input terminals. The computation circuit is coupled to the operational amplifier and arranged to the recover a plurality of sensed signals of a plurality of pixel circuits according to a plurality of output signals that are outputted by the operational amplifier. The sensed signals are recovered according to the output signals and a plurality of switch controlling signals in the amplifier output cycles; and each switching controlling signal corresponds to one of the amplifier output cycles. Additionally, in each amplifier output cycle, at least two switching devices are turned on, such that the operational amplifier receives the sensed signals of at least two pixel circuits simultaneously.

According to one embodiment, an image sensor is provided. The image sensor comprises: a pixel array and a readout circuit. The readout circuit is coupled to the pixel circuit array and arranged read sensed signals of the pixel array. The readout circuit comprises: an operational amplifier, a plurality of switching devices and a computation circuit. The operational amplifier is arranged to generate an output signal according to input signals on a set of differential input terminals in each one of a plurality of amplifier output cycles. Each of the switching devices is coupled between a pixel circuit of the pixel array and the differential input terminals. In each amplifier output cycle, each switching devices is controlled by a switch controlling signal to selectively turn on, thereby to selectively couple the pixel circuit to the differential input terminals. The computation circuit is coupled to the operational amplifier and arranged to the recover a plurality of sensed signals of a plurality of pixel circuits according to a plurality of output signals that are outputted by the operational amplifier. The sensed signals are recovered according to the output signals and a plurality of switch controlling signals in the amplifier output cycles; and each switching controlling signal corresponds to one of the amplifier output cycles. Additionally, in each amplifier output cycle, at least two switching devices are turned on, such that the operational amplifier receives the sensed signals of at least two pixel circuits simultaneously.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
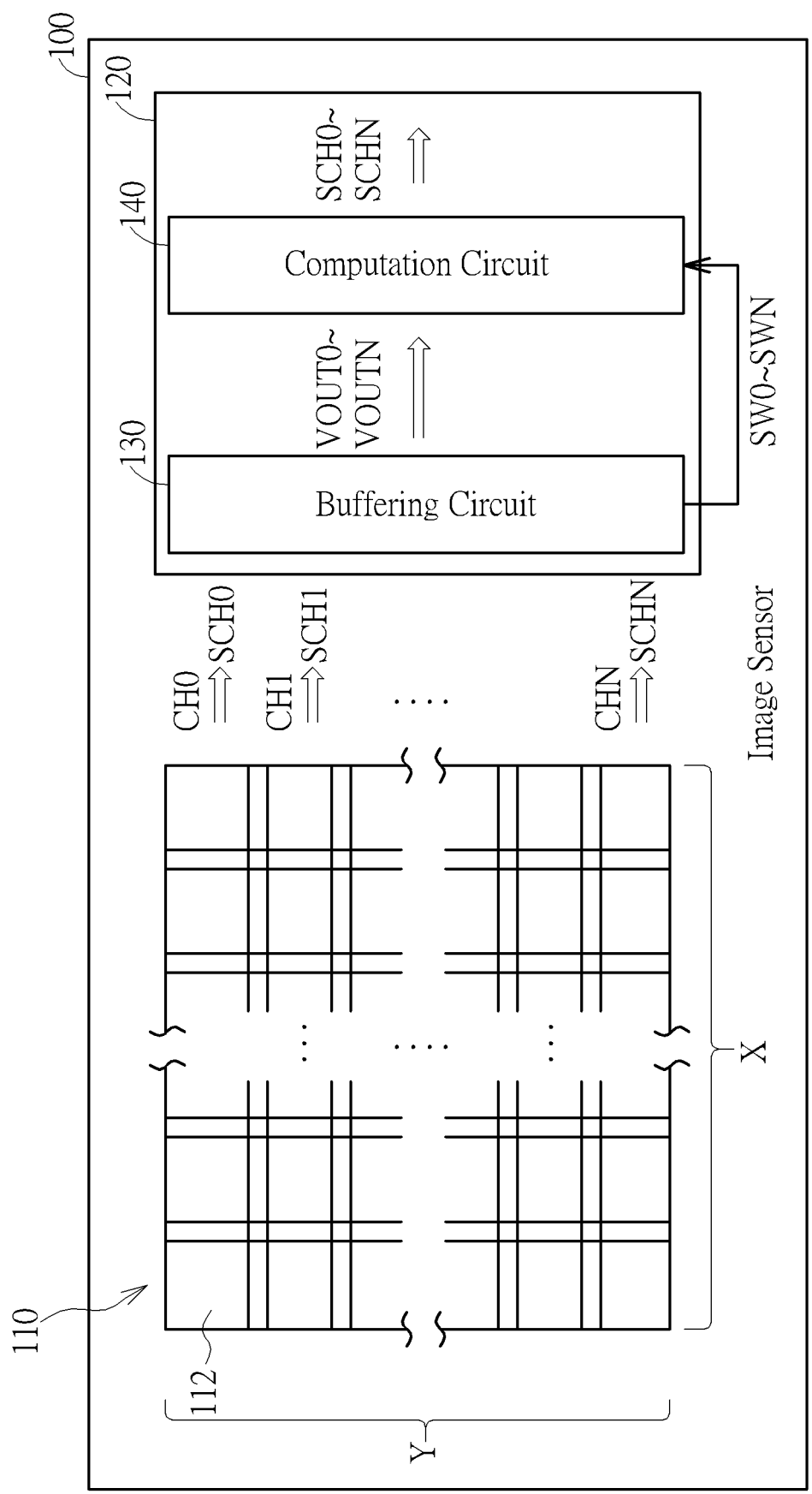
FIG. 1 is a diagram illustrating an image sensor according to one embodiment of the present invention.

Certain terms are used throughout the following descriptions and claims to refer to particular system components. As one skilled in the art will appreciate, manufacturers may refer to a component by different names. This document does not intend to distinguish between components that differ in name but not differ in functionality. In the following discussion and in the claims, the terms "include", "including", "comprise", and "comprising" are used in an open-ended fashion, and thus should be interpreted to mean "including, but not limited to . . . " The terms "couple" and "coupled" are intended to mean either an indirect or a direct electrical connection. Thus, if a first device couples to a second device, that connection may be through a direct electrical connection, or through an indirect electrical connection via other devices and connections.

Different features of the present invention are detailed as below in reference to the figures, and for convenience of explanation, the same elements in separate figures are indicated by the same reference numerals. Moreover, reference throughout this specification to "one embodiment" means that a particular feature, structure or characteristic described in connection with the embodiment or example is included in at least one embodiment of the present embodiments. Thus, appearances of the phrases "in one embodiment", in various places throughout this specification are not necessarily all referring to the same embodiment or example. Furthermore, the particular features, structures or characteristics may be combined in any suitable combinations and/or sub-combinations in one or more embodiments or examples.

Please refer to FIG. 1, which is a diagram illustrating an image sensor according to one embodiment of the present invention. As illustrated, an image sensor 100 comprises a pixel circuit array 110 and a readout circuit 120. The pixel array 110 includes X*Y pixel circuits 112. Sensed signals on the pixel circuits 112 are transmitted to the readout circuit 120 through channels CH0-CHN. In an operating cycle of the readout circuit 120, the readout circuit 120 could read sensed signals of an entire row of pixel circuits 112 of the pixel array 110 or an entire column of pixel circuits 112 of the pixel array 110 through channels CH0-CHN. Alternatively, the readout circuit 120 could read sensed signals of a portion of the entire row of pixel circuits 112 or a portion of the entire column of pixel circuits 112 in an operating cycle of the readout circuit 120. Additionally, the pixel array 110 could further comprise control logic that is operable to control an entire row of pixel circuits 112/an entire column of pixel circuits 112 or a portion of an entire row of pixel circuits 112/a portion of an entire column of pixel circuits 112 to couple to the channels CH0-CHN in an operating cycle of the readout circuit 120. Please note that, the image sensor 100 may further comprise other circuits that are arranged to assist exposing the pixel circuits and reading/outputting the sensed signals. However, further explanations regarding these circuits are omitted here for the sake of the brevity.

In one embodiment, the readout circuit 120 comprises a buffering circuit 130 and a computation circuit 140. The buffering circuit 130 is arranged to receive channel signals SCH0-SCHN from the pixel array 110 through channels CH0-CHN. The buffering circuit 130 is also arranged to amplify, store and sum the channel signals SCH0-SCHN, thereby to generate output signals VOUT0-VOUTN to the computation circuit 140 in an operating cycle. The computation circuit 140 recovers the channel signals SCH0-SCHN according to the output signals VOUT0-VOUTN and a set of matrices SW0-SWN. In one embodiment, matrices SW0-SWN is associated with switch controlling of the buffering circuit 130, which substantially encodes the channel signals SCH0-SCHN (illustrated in FIG. 3 and will be detailed later). Based on the encoding applied to the channel signals SCH0-SCHN, the computation circuit 140 could recover the channel signals SCH0-SCHN, which are actually the sensed signals of an entire row/column of the pixel circuits 112 or a portion of an entire row/column of pixel circuits 112. By repeating the above-mentioned procedures, the readout circuit 120 could read entire pixel array 110 after a plurality of operating cycles.

Figure 2:
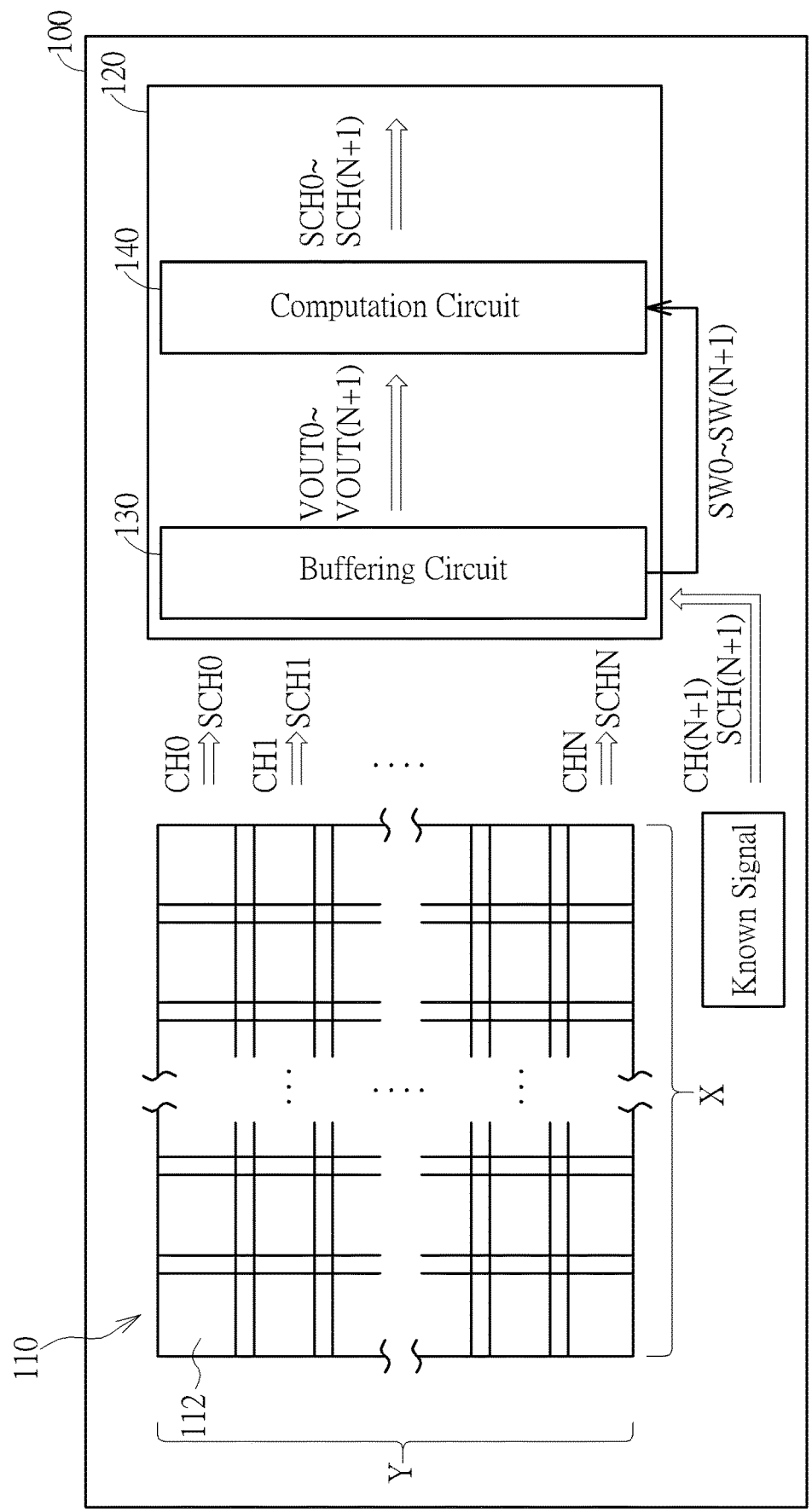
FIG. 2 is a diagram illustrating an image sensor according to another embodiment of the present invention.

In the embodiment shown by FIG. 2, in one operating cycle, in addition to transmit the sensed signals to the readout circuit 120 through the channels CH0-CHN, a known signal which generated by a circuit internal or external to the image sensor 100 will also be transmitted to the readout circuit 120 through the channel CH(N+1). That is, the buffering circuit 130 not only receives signals SCH0-SCHN from the pixel array 110 through the channels CH0-CHN, but also receives the known signal SCH(N+1) through the channel CH(N+1), thereby to amplify/store and sum these signals to obtain the output signals VOUT0-VOUT(N+1). The computation circuit 140 recovers the channel signals SCH0-SCHN according to the output signals VOUT0-VOUT(N+1) and a set of matrices SW0-SW(N+1). In this embodiment, the intended purpose of introducing the known signal is to reduce the cross-correlation of encoding of channel signals SCH0-SCHN when the number of the channels CH0-CHN is an even number, such that the computation circuit 140 can recover the channel signals SCH0-SCHN from the output signals VOUT0-VOUT(N+1) more easily.

Figure 3:
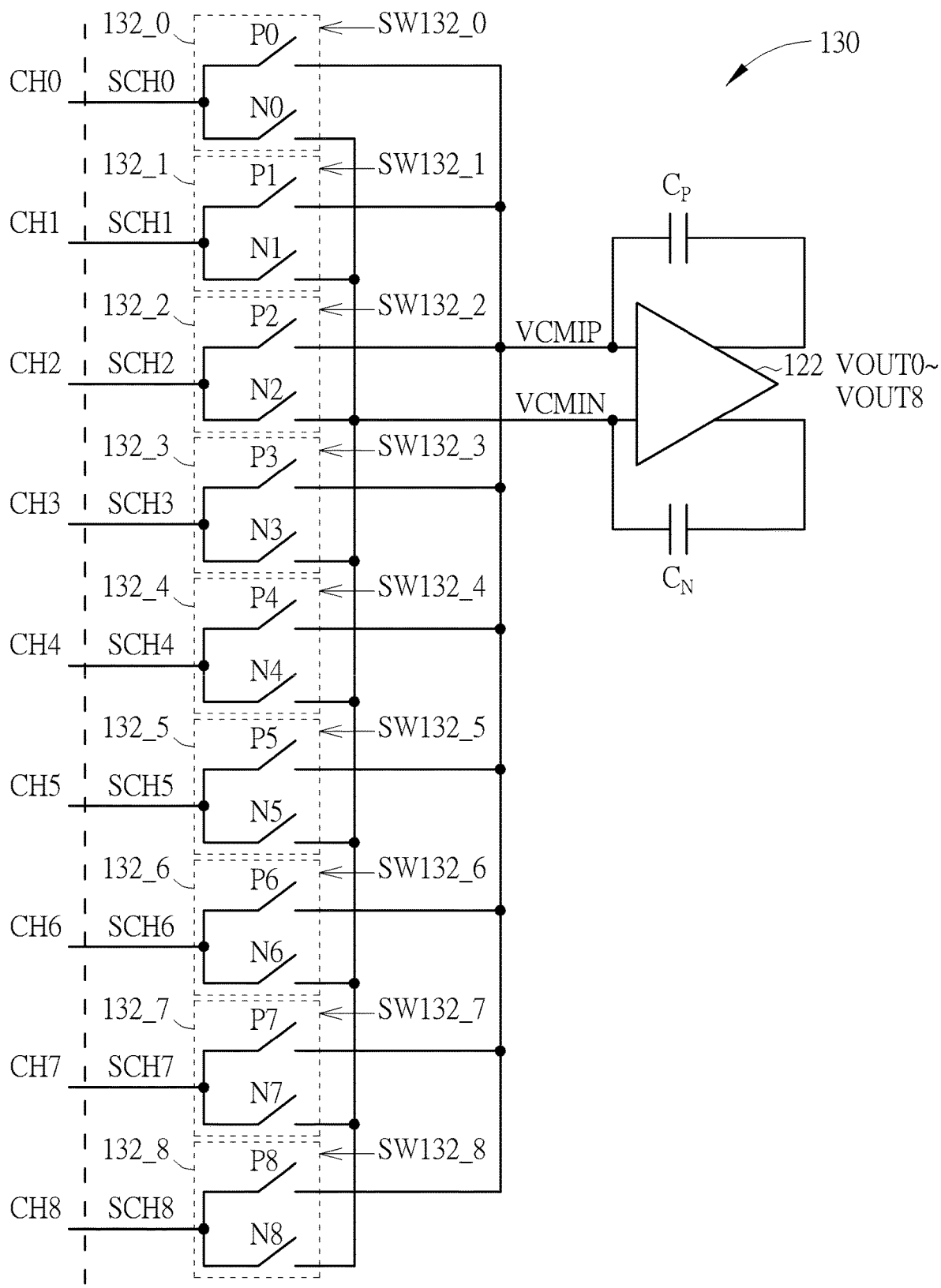
FIG. 3 is a diagram illustrating a buffering circuit according to one embodiment of the present invention.

Please continue to FIG. 3, which is a structure diagram of the buffering circuit shown in FIG. 1 according to one embodiment of the present invention. As illustrated, the buffering circuit 130 comprises an operational amplifier 122, a plurality of switching devices 132_0, 132_1, . . . and 132_8 and feedback capacitors $C_P$ and $C_N$. Each of the switching devices 132_0, 132_1, . . . and 132_8 comprises two switches (P0, N0), (P1, N1), . . . and (P8, N8). For example, the switching device 132_0 comprises switches P0 and N0, the switching device 132_1 comprises switches P1 and N1 . . . and so on. During operating, each of the switching devices is controlled by a corresponding one of switch controlling signals SW132_0-SW132_8, thereby to selectively turn on at most one switch of each switching device, such that the channel signals SCH0-SCH8 can be transmitted to the positive input terminal VCMIP or the negative input terminal VCMIN of the differential input terminals of the operational amplifier 122, or even not to be transmitted.

In one embodiment, an operating cycle of the readout circuit 120 includes 9 amplifier output cycles $t_0$-$t_8$. In one amplifier output cycle $t_i$, at least two switching devices are turned on at the same time. For example, in a first amplifier output cycle $t_0$, the switch P0 of the switching device 132_0 is turned on while the switch N1 of a switching device 132_1 is turned on, such that signals on the channels CH0 and CH1 are transmitted to positive terminal VCMIP and negative terminal and VCMIN, respectively. As a consequence, the operational amplifier 122 generates an output signal VOUT0 that is substantially equal to a sum of the channel signal SCH0 on the channel CH0 and the channel signal SCH1 on the channel CH1 (i.e., VOUT0=SCH0-SCH1).

For another example, in a second amplifier output cycle $t_1$, the switch P0 of the switching device 132_0 is turned on, the switch P1 of the switching device 132_1 is turned on and the switch P2 of the switching device 132_2 is turned on, such that signals on the channels CH0, CH1 and CH2 are all transmitted to the positive terminal VCMIP. As a consequence, the operational amplifier 122 generates an output signal VOUT1 that is substantially equal to a sum of channel signals SCH0, SCH1 and SCH2 on the channels CH0, CH1 and CH2 (i.e., VOUT1=SCH0+SCH1+SCH2).

To put it briefly, in each amplifier output cycle $t_i$, each of the output signals VOUT0-VOUT8 outputted by the operational amplifier 122 is substantially identical to a sum of more than two of the channel signals SCH0-SCH8 on the channels CH0-CH8. In view of above, each of the channel signals SCH0-SCH8 is multiplied by a factor (+1, 0 or −1) and summed to obtain the output signals VOUT0-VOUT8. Therefore, each of the output signals VOUT0-VOUT8 can be considered as information regarding encoded channel signals SCH0-SCH8. Please note that each of the channel signals SCH0-SCH8 will be transmitted to the operational amplifier 122 during at least one amplifier output cycle $t_i$ in order to read out all of the channel signals SCH0-SCH8 after an entire operating cycle ends.

Figure 4:
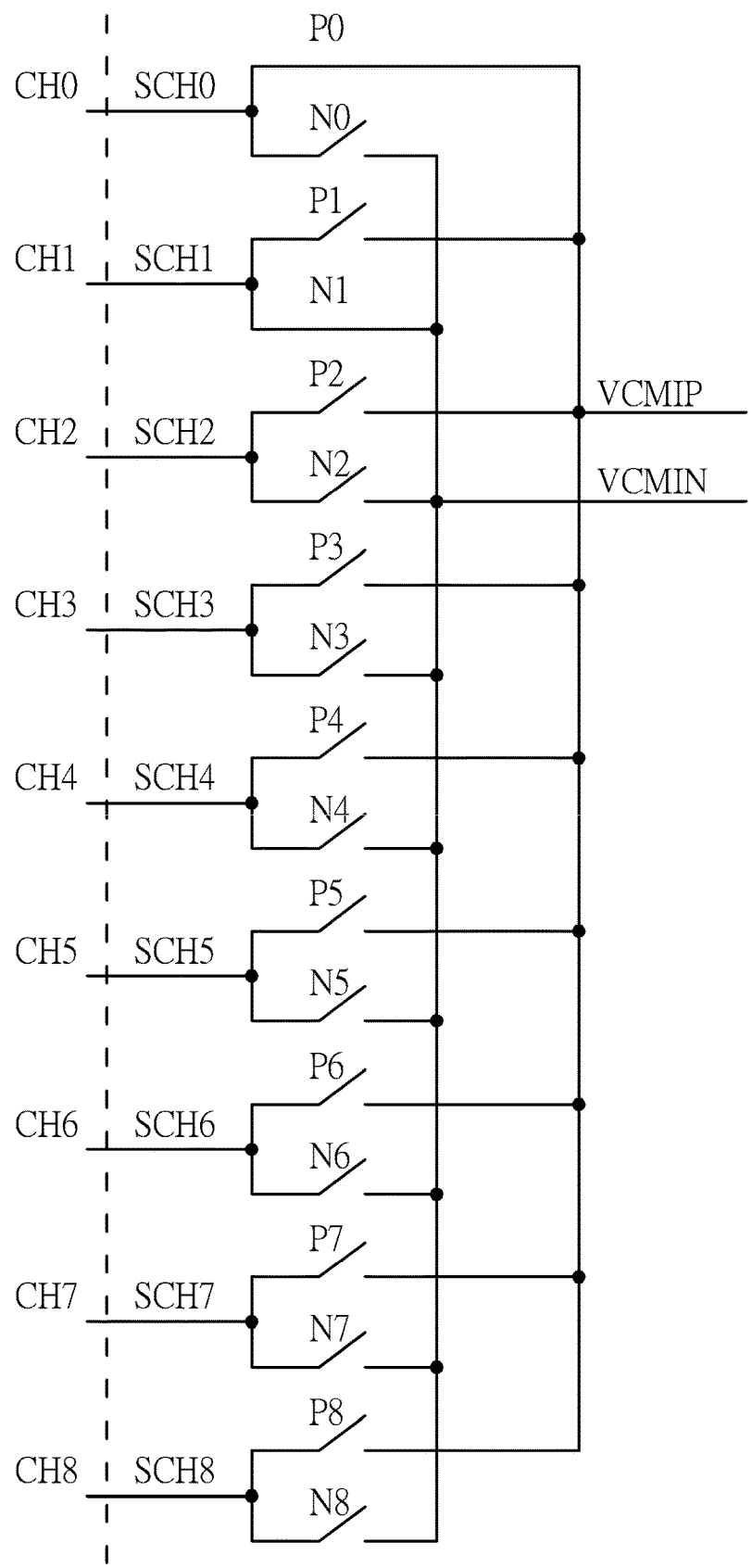
FIG. 4 and FIG. 5 illustrate relationship between conductive states of switching devices and switch controlling vectors according to one embodiment of the present invention.
Figure 5:
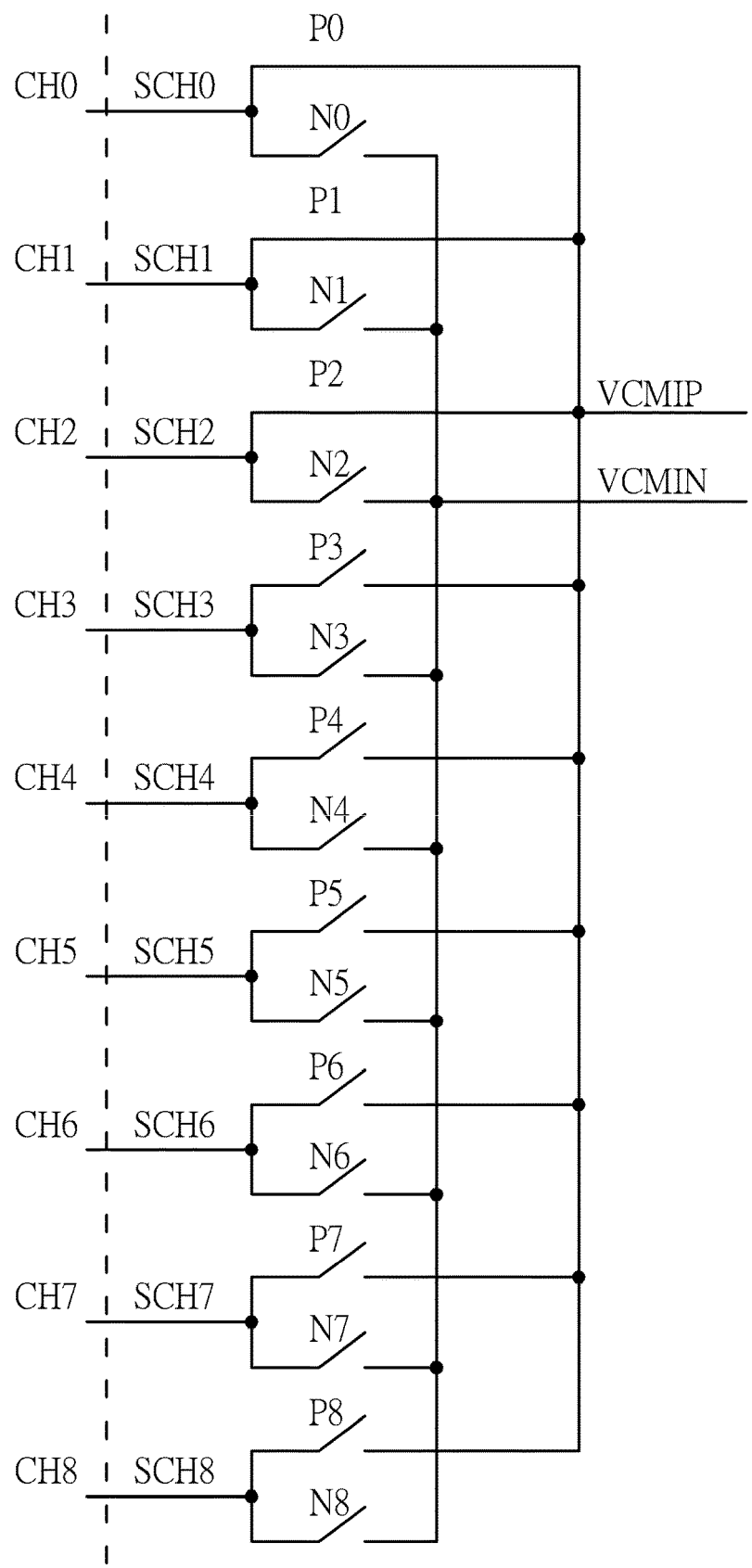

In one embodiment, the readout circuit 120 generates 9 output signals VOUT0-VOUT8 in accordance with 9 amplifier output cycles $t_0$-$t_8$. The computation circuit 140 is coupled to the output terminal of the operational amplifier 122 and arranged to perform a recovery computation on the output signals VOUT0-VOUT8 according to switch controlling signals that are respectively utilized in amplifier output cycles $t_0$-$t_8$, thereby to recover channel signals SCH0-SCH8 on each of channels CH0-CHN. Principles of the recovery computation is explained as follow. Assuming that in the first amplifier output cycle $t_0$, the switch controlling signal SW132_0 allows the switch P0 in the switching device 132_0 to turn on and the switch controlling signal SW132_1 allows the switch N1 in the switching device 132_1 to turn on, a switch controlling vector SW0=[1, −1, 0, 0, 0, 0, 0, 0, 0] that is associated with the first amplifier output cycle $t_0$ can be obtained, where "+1" refers to those switches coupled to the positive input terminal VCMIP of the operational amplifier 122 are turned on, while "−1" refers to those switches coupled to the negative input terminal VCMIN of the operational amplifier 122 are turned on. In a second amplifier output cycle $t_1$, the switch controlling signal SW132_0 allows the switch P0 of switching device 132_0 to turn on, the switch controlling signal SW132_1 allows the switch P1 of switching device 132_1 to turn on and the switch controlling signal SW132_2 allows the switch P2 of switching device 132_2 to turn on. Thus, a switch controlling vector SW1=[1, 1, 1, 0, 0, 0, 0, 0, 0] that is associated with the second amplifier output cycle $t_1$ can be obtained. FIG. 4 and FIG. 5 illustrate relationships between conductive states of the switching device and the switch controlling vectors more specifically. FIG. 4 illustrates conductive states of the switches in the above-mentioned first amplifier output cycle $t_0$, which corresponds to the switch controlling vector SW0=[1, −1, 0, 0, 0, 0, 0, 0, 0]. FIG. 5 illustrates conductive states of the switches in the above-mentioned second amplifier output cycle $t_1$, which corresponds to the switch controlling vector SW1=[1, 1, 1, 0, 0, 0, 0, 0, 0].

9 switch controlling vectors SW0-SW8 corresponding to 9 amplifier output cycles $t_0$-$t_8$ can be represented as a matrix:

$$\begin{bmatrix} SW0 \\ SW1 \\ SW2 \\ SW3 \\ SW4 \\ SW5 \\ SW6 \\ SW7 \\ SW8 \end{bmatrix}$$

Therefore, the output signals VOUT0-VOUT8 can be expressed in form of:

$$\begin{bmatrix} SW0 \\ SW1 \\ SW2 \\ SW3 \\ SW4 \\ SW5 \\ SW6 \\ SW7 \\ SW8 \end{bmatrix} \begin{bmatrix} SCH0 \\ SCH1 \\ SCH2 \\ SCH3 \\ SCH4 \\ SCH5 \\ SCH6 \\ SCH7 \\ SCH8 \end{bmatrix} = \begin{bmatrix} VOUT0 \\ VOUT1 \\ VOUT2 \\ VOUT3 \\ VOUT4 \\ VOUT5 \\ VOUT6 \\ VOUT7 \\ VOUT8 \end{bmatrix}$$

According to the following equation, the channel signals SCH0-SCH8 can be recovered thereform:

$$\begin{bmatrix} SCH0 \\ SCH1 \\ SCH2 \\ SCH3 \\ SCH4 \\ SCH5 \\ SCH6 \\ SCH7 \\ SCH8 \end{bmatrix} = \begin{bmatrix} SW0 \\ SW1 \\ SW2 \\ SW3 \\ SW4 \\ SW5 \\ SW6 \\ SW7 \\ SW8 \end{bmatrix}^{-1} \begin{bmatrix} VOUT0 \\ VOUT1 \\ VOUT2 \\ VOUT3 \\ VOUT4 \\ VOUT5 \\ VOUT6 \\ VOUT7 \\ VOUT8 \end{bmatrix}$$

According to 9 output signals VOUT0-VOUT8 outputted by the operational amplifier 122 in 9 amplifier output cycles $t_0$-$t_8$ and 9 vectors SW0-SW8 corresponding to switch controlling signals SW132_0-SW132_8 that are used to control switching devices 132_0-132_8 during 9 amplifier output cycle $t_0$-$t_8$, the computation circuit 140 can compute the inverse matrix to recover the channel signals SCH0-SCH8 from the output signals VOUT0-VOUT8.

Please note that even though certain numbers are mentioned in explaining the above embodiments, they are not limitations of the present invention, however. According to various embodiments of the present invention, different numbers may be selected and used, such as, the number of selected pixel circuits in an operating cycle of the readout circuit 120, or the number of the switching devices that are turned on simultaneously in one amplifier output cycle. These numbers could be modified on different demands. In one embodiment, the computation circuit 140 could each time recover an odd number of channel signals, wherein the odd number of channel signals could be all the sensed signals on an odd number of pixel circuits (e.g., the configuration of FIG. 1) or the sensed signal on an even number of pixel circuits with one known signal (e.g. the configuration of FIG. 2). These different configurations are related to channel coding. Generally, the pseudo-random code has the least cross-correlation. The pseudo-random code of size N has the highest auto-correlation (N−1) and the least cross-correlation (−1). However, when the pseudo-random code is applied to encoding an even number of channels, the cross-correlation thereof is not as favorable as an odd number of channels. That is, if the number of channel signals each time the computation circuit 140 recovers is an odd number, it will be easier for the computation circuit 140 to perform recovery computation.

In addition, even though the buffering circuit 130 merely includes one operational amplifier 122 in the above-mentioned embodiments, this is not intended to limit the present invention in scope. In various embodiments, the buffering circuit 130 could include a plurality of operational amplifiers 122 based on different design requirements, thereby to simultaneously read sensed signals of different pixel circuits. For example, if each row of the pixel array 110 includes 720 pixel circuits, the buffering circuit 130 could include 80 operational amplifiers 122. Therefore, in one operating cycle, each operational amplifier 122 reads 9 channel signals. As a result, the computation circuit 140 can recover the channel signals of 720 channels in an operating cycle, which are actually the sensed signals of 720 pixel circuits. Please note that the above-mentioned number is intended for illustrative purposes rather than limiting the present invention in scope.

Figure 6:
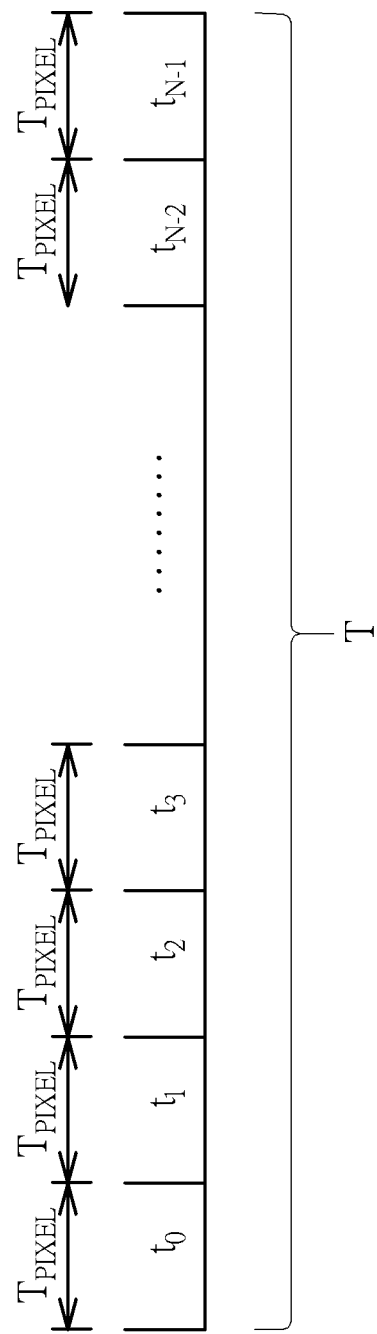
FIG. 6 illustrates exposure time of a single pixel in the case where a shared operational amplifier is used in a conventional image sensor.
Figure 7:
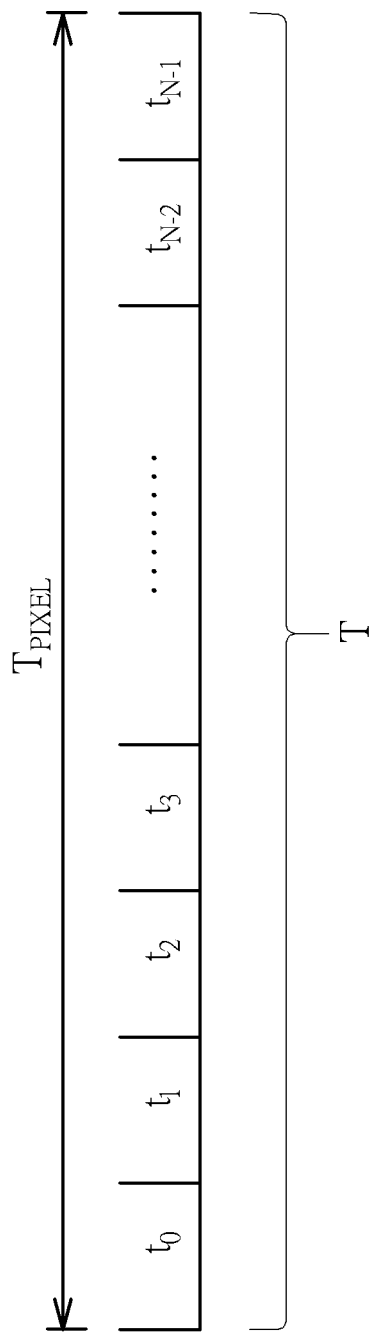
FIG. 7 illustrates exposure time of a single pixel in the case where a shared operational amplifier is used in an image sensor according to embodiment of the present invention.

FIG. 6 and FIG. 7 illustrate difference between exposure time of a single pixel circuit in the conventional image sensor and in the image sensor of the present invention where a shared operational amplifier is used. As illustrated, in the conventional image sensor, the sensed signal of a pixel circuit needs to be outputted within a single one of the amplifier output cycles $t_0$-$t_N$. Therefore, the exposure time $T_{PIXEL}$ for a single pixel circuit cannot exceed the period of one of the amplifier output cycles $t_0$-$t_N$. Compared to this, the image sensor of the present invention allows a sensed signal of a pixel circuit can be read out over multiple amplifier output cycles $t_0$-$t_N$ and thus exposure time $T_{PIXEL}$ for a single pixel circuit could exceed the length of one of the amplifier output cycles $t_0$-$t_N$. Specifically, if a certain pixel circuit is read during each of the amplifier output cycles $t_0$-$t_N$, the longest exposure time $T_{PIXEL}$ will be identical to the period of the operating cycle T of the readout circuit 120, which will be N times the period of the exposure time of a single pixel circuit in the conventional image sensor.

In conclusion, the present invention significantly extend the exposure time available for a single pixel circuit while using the shared operational amplifier. Specifically, the present invention allows the pixel circuits at different rows or at different columns to be exposed simultaneously, and allows the sensed signals from different rows or columns to be summed by the shared operational amplifier 122 and read. Moreover, the present invention also encodes the channel signals SCH0-SCHN (i.e., applying the factors +1, 0, −1 to each of the channel signals SCH0-SCHN through the controlling of the switching device) when summing the channel signals SCH0-SCHN. Thus, based on the applied encoding, the sensed signals from different rows/columns of the pixel circuits can be correctly separated and recovered from the output signals VOUT0-VOUTN.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A readout circuit for reading sensed signals of a pixel array, comprising:
   an operational amplifier, arranged to generate an output signal according to input signals on a set of differential input terminals in each one of a plurality of amplifier output cycles;
   a plurality of switching devices, each of which coupled between a pixel circuit of the pixel array and the differential input terminals, wherein, in each amplifier output cycle, each switching device is controlled by a switch controlling signal to selectively turn on, thereby to selectively couple the pixel circuit to the differential input terminals; and
   a computation circuit, coupled to the operational amplifier, arranged to recover a plurality of sensed signals of a plurality of pixel circuits according to a plurality of output signals that are outputted by the operational amplifier, wherein the sensed signals are recovered according to the output signals and a plurality of switch controlling signals in the amplifier output cycles; and each switch controlling signal corresponds to one of the amplifier output cycles;
   wherein, in each amplifier output cycle, at least two switching devices are turned on, such that the operational amplifier receives the sensed signals of at least two pixel circuits simultaneously.

2. The readout circuit of claim 1, wherein each switching device comprises two switches; in each amplifier output cycle, at most one switch of each switching device is turned on, thereby the corresponding pixel circuit is coupled to either a positive input terminal or a negative input terminal of the set of differential input terminals.

3. The readout circuit of claim 2, wherein in one amplifier output cycle, at least one of the switching devices is not turned on.

4. The readout circuit of claim 1, wherein the readout circuit completes the reading of at least (N−1) pixel circuits within N amplifier output cycles, and exposure time of each pixel circuit is N*T, where T is the period of the amplifier output cycle.

5. The readout circuit of claim 4, wherein N is an odd number.

6. The readout circuit of claim 1, further comprising: a known-signal switching device arranged to couple between a known-signal and the differential input terminals of the operational amplifier, wherein the known-signal switching device is turned on to avow the operational amplifier to simultaneously receive the known signal and the sensed signal in at least one amplifier output cycle.

7. An image sensor, comprising:
   a pixel array; and
   a readout circuit, coupled to the pixel circuit array, arranged read sensed signals of the pixel array, comprising:

an operational amplifier, arranged to generate an output signal according to input signals on a set of differential input terminals in each one of a plurality of amplifier output cycles;

a plurality of switching devices, each of which coupled between a pixel circuit of the pixel array and the differential input terminals, wherein, in each amplifier output cycle, each switching device is controlled by a switch controlling signal to selectively turn on, thereby to selectively couple the pixel circuit to the differential input terminals; and a computation circuit, coupled to the operational amplifier, arranged to recover a plurality of sensed signals of a plurality of pixel circuits according to a plurality of output signals that are outputted by the operational amplifier, wherein the sensed signals are recovered according to the output signals and a plurality of switch controlling signals in the amplifier output cycles; and each switch controlling signal corresponds to one of the amplifier output cycles;

wherein, in each amplifier output cycle, at least two switching devices are turned on, such that the operational amplifier receives the sensed signals of at least two pixel circuits simultaneously.

8. The image sensor of claim 7, wherein each switching device comprises two switches; in each amplifier output cycle, at most one switch of each switching device is turned on, thereby the corresponding pixel circuit coupled to either a positive input terminal or a negative input terminal of the set of differential input terminals.

9. The image sensor of claim 8, wherein in one amplifier output cycle, at least one of the switching devices is not turned on.

10. The image sensor of claim 7, wherein the readout circuit completes the reading of at least (N−1) pixel circuits within N amplifier output cycles, and exposure time of each pixel circuit is N*T, where T is the period of the amplifier output cycle.

11. The image sensor of claim 10, wherein N is an odd number.

12. The image sensor of claim 10, wherein the readout circuit further comprises:

a known-signal switching device arranged to couple between a known signal and the differential input terminals of the operational amplifier, wherein the known-signal switching device is turned on to allow the operational amplifier to simultaneously receive the known signal and the sensed signal in at least one amplifier output cycle.

* * * * *